(12) United States Patent
Miller et al.

(10) Patent No.: US 6,402,452 B1
(45) Date of Patent: Jun. 11, 2002

(54) CARRIER TAPE FEEDER WITH COVER TAPE PARTING

(75) Inventors: James G. Miller, Hilton; John Piccone, Webster, both of NY (US)

(73) Assignee: Hover-Davis, Inc., Rochester, NY (US)

( * ) Notice: Subject to any disclaimer, the term of this patent is extended or adjusted under 35 U.S.C. 154(b) by 0 days.

(21) Appl. No.: 09/558,114

(22) Filed: Apr. 25, 2000

Related U.S. Application Data
(60) Provisional application No. 60/131,041, filed on Apr. 26, 1999.

(51) Int. Cl.$^7$ .............................................. H05K 13/02
(52) U.S. Cl. ................... 414/412; 414/416.06; 156/584
(58) Field of Search ................. 414/403, 411, 414/412, 416.06, 416.01; 156/584

(56) References Cited

U.S. PATENT DOCUMENTS

| | | |
|---|---|---|
| 4,327,482 A | 5/1982 | Araki et al. |
| 4,586,670 A | 5/1986 | Vancelette et al. |
| 4,735,341 A | 4/1988 | Hamilton et al. |
| 4,820,369 A | 4/1989 | Kubo |
| 5,299,902 A | 4/1994 | Fujiwara et al. |
| 5,725,140 A | 3/1998 | Weber et al. |

FOREIGN PATENT DOCUMENTS

| | | | |
|---|---|---|---|
| DE | 3214600 A1 | 10/1983 | |
| JP | 3-30442 | * 2/1991 | |
| JP | 6-232593 | * 8/1994 | |
| JP | 9-18191 | * 1/1997 | |

OTHER PUBLICATIONS

EIA Standard: 8mm & 12mm Punched & EMbossed Carrier Taping of Surface Mount Components for Automatic Handling (EIA–481–1–1); American National, Standard/Electronic Industries Association Aug. 1994–1–11.

* cited by examiner

*Primary Examiner*—Steven A. Bratlie
(74) *Attorney, Agent, or Firm*—Greenwald & Basch LLP; Duane C. Basch

(57) ABSTRACT

The present invention is a method and apparatus for parting and peeling-back the cover tape on a carrier tape (consisting of a component tape with pockets therein and cover tape thereover) in order to expose the component for retrieval by an automated assembly system. More specifically, the cover tape is parted along one edge, or slit in the middle for wider component tapes. The cover tape flap(s) created by the parting operation are then retracted back away from the region above the component, whereby the component is exposed for retrieval at the pick-up location. Subsequent to the pick-up location the carrier tape, with the parted cover tape flap(s) still attached thereto, is directed to a waste receptacle or similar disposal mechanism, avoiding the need for a separate cover tape take-up reel.

16 Claims, 7 Drawing Sheets

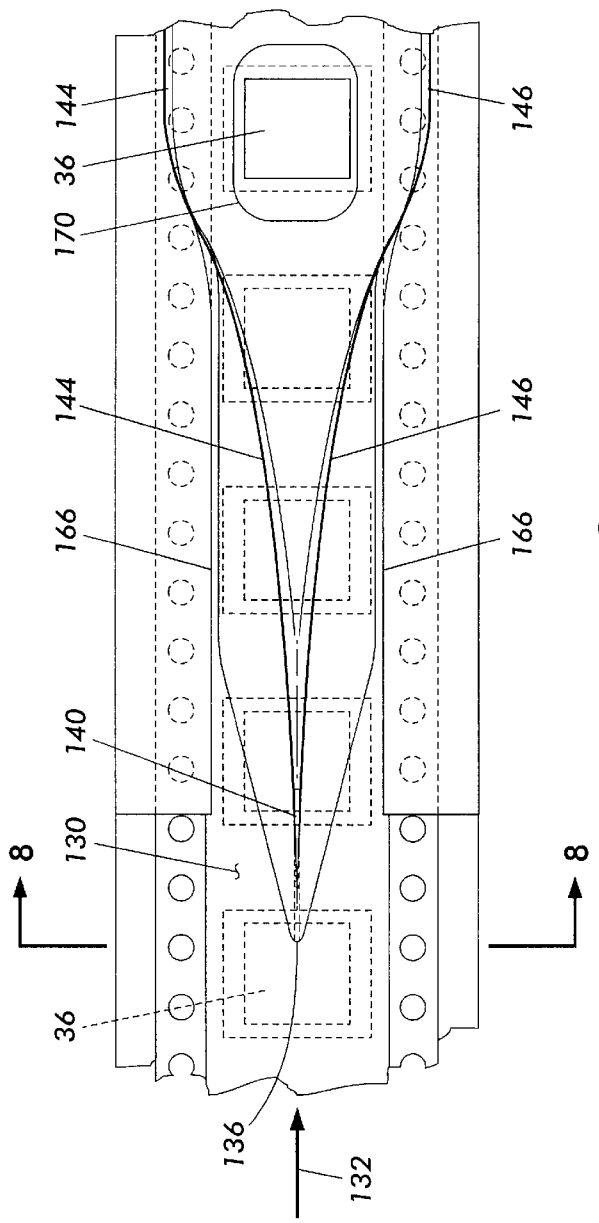
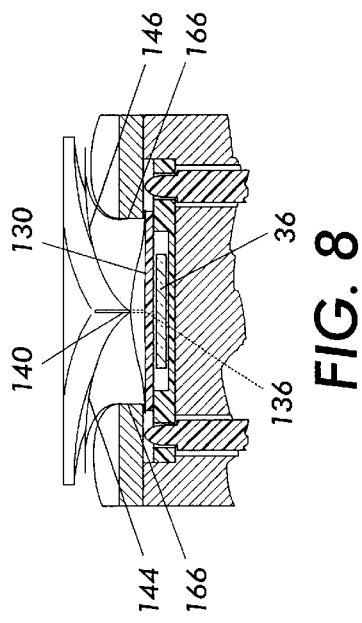
FIG. 7
FIG. 8

CARRIER TAPE FEEDER WITH COVER TAPE PARTING

This application claims benefit of Prov. No. 60/131,041 filed Apr. 26, 1999.

This invention relates generally to component feeding systems, and more particularly to carrier tape-based component feeding systems used in conjunction with surface-mount or equivalent automated assembly systems.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND AND SUMMARY OF THE INVENTION

The present invention is directed to an improvement of tape or component feeders used in printed circuit assembly technology in which electronic components are placed at precise locations on the surface of a printed circuit board. As illustrated by the Hover-Davis MPF and QP2F products, component tape feeders are used for sequentially feeding surface-mount components to a host assembly system. The host system typically includes a pick-and-place machine having an automated or robotic head for retrieving the component from the component feeder and placing the component on the surface of a printed circuit board that is being assembled.

For ease of delivery and handling, components are often stored in a carrier tape as depicted in Prior Art FIG. 10. Carrier tape 30, consists of a flexible base or component tape layer 32 of paper, metal or plastic having pockets 34 at regular intervals along its length. Carried within each pocket is one component 36 to be placed on the printed circuit board. The components 36 are secured within their respective pockets using a thin, generally transparent material 40, commonly referred to as "cover tape" or "cover layer" that extends the length of the carrier tape, and is generally slightly wider than the pockets that it covers. The cover tape is typically fastened to the carrier tape with a pressure or temperature activated adhesive along each of its two longitudinal edges. The carrier tape may also include a plurality of through-holes 42 spaced at a predefined pitch, wherein a drive mechanism is able to engage the holes and advance the tape at a controlled rate/distance in order to accurately present the components to the pick-up location.

In component tape feeders, such as the Hover-Davis models noted above, a tape feeder advances the carrier tape to position a pocket, and therefore a component within the pocket, at a predetermined pick-up point, where the host pick and place machine is able to retrieve the component for placement on the printed circuit board. As the carrier tape is advanced off of a supply reel, the cover tape is typically pulled or peeled back from the carrier tape and wound upon a cover tape take-up reel, thereby exposing the pocket 34 and the component 36 before it reaches the pick-up point.

A long-standing problem with this technology has been the disposition of the cover tape. Two main methods are in use for dealing with the problem. The first is to wind the cover tape on a take-up reel located above and behind the pick point.

Examples of patents in which this solution is employed include U.S. Pat. Nos. 4,327,482; 4,735,341; and 5,299,902, the teachings of which are hereby incorporated by reference. A problem with this method is that in order for the cover tape take-up reel to be reused, the cover tape has to be manually removed therefrom. In addition, the cover tape must initially be threaded, or otherwise attached, to the take-up reel for the winding of the cover tape around the reel to occur. This is often accomplished with adhesive tape or similar product, however, attachment requires that a sufficient quantity of the cover tape be available to reach the take-up reel and attach thereto. Furthermore, the take-up reel requires not only time, but also that an adhesive tape (e.g., masking or splicing tape) be readily available when cinching a new take-up reel for the carrier tape.

A second method of handling the cover tape after it is peeled back from the carrier tape involves using a pair of pinch rollers to push the cover tape into a reservoir. U.S. Pat. No. 5,725,140 to Weber et al., also incorporated herein by reference, discloses this method. While such a system resolves the take-up reel problem, it still requires separate mechanisms for driving/pulling and disposal of the cover tape, and the cover tape must still be started with a measure of the cover tape being routed through the feeder to the pinch rollers and through the pinch rollers each and every time a new reel of component tape is started or restarted in the feeder.

Another method is disclosed in U.S. Pat. No. 4,586,670, which is also incorporated herein by reference. In this method, two pinch rollers are also used, however, instead of pushing the cover tape into a bin, the cover tape is allowed to drop into a waste receptacle. The problem with this method is that it increases the width of the feeder, which means fewer feeders can service a single host pick and place machine. In addition, the cover tape, which is very thin and generally made of a plastic material, often accumulates a static charge and may stick to the feeder or other surfaces after it has been cut or chopped.

The present invention solves the various problems described above by avoiding the complete separation of the carrier tape layers (component tape and the cover tape or cover layer)—thereby allowing the disposal of the component tape to accomplish disposal of the cover tape as well. More specifically, the cover tape is parted along one edge, or slit in the middle for wider component tapes. The cover tape flap(s) created by the parting operation are then retracted or folded back away from the region above the component, whereby the component is exposed for retrieval at the pick-up location. Subsequent to the pick-up location, the carrier tape with the parted cover tape flap(s) still attached thereto, is then directed to a waste receptacle or similar disposal mechanism, eliminating the need for a cover tape take-up reel.

In accordance with the present invention, there is provided a component feeding apparatus for supplying components to an automated assembly system, said system using a component feeding means having a length of carrier tape with a plurality of regularly spaced pockets in the component tape, each pocket holding a component therein, and a cover tape thereover to retain the components within each pocket until the component approaches a pick-up location, the apparatus comprising: means for parting the cover tape so as to partially expose the component while keeping at least one edge of said cover tape affixed to the component tape; and a channel for guiding a cover tape flap around the pick-up location, whereby the component is completely exposed and the cover tape flap will not interfere with retrieval of the component at the pick-up location. In accordance with an alternative embodiment of the above-described invention, said parting means may include a heating element for applying heat to the cover tape along the edge to be parted.

In accordance with another aspect of the present invention, there is provided a component feeder for supplying electronic components to an automated assembly system for assembling printed circuit boards, said system using a component feeding means having a length of carrier tape with a plurality of regularly spaced pockets in a component tape, each pocket holding a component therein, and a cover tape thereover to hold the components within each pocket until the component approaches a pick-up location, comprising: a means for separating a single edge of a cover tape from the component tape and folding said cover tape along a line adjacent to a second edge at least about 90 degrees from the plane of said component tape; and means for maintaining said cover tape in retracted condition as said component tape passes a pick-up location where successive pockets in said component tape are exposed, such that a pick and place machine may have access to any electrical components located in a pocket located at said pick-up location.

In accordance with yet another aspect of the present invention, there is provided, in a component feeding apparatus for supplying components to an automated system for assembling printed circuit boards, said system using a component feeding means having a length of carrier tape, the carrier tape including a plurality of regularly spaced pockets in a component tape, each pocket holding a component therein, and a cover tape thereover to retain the components within each pocket until the component approaches a pick-up location, a method of presenting components for retrieval at the pick-up location, comprising the steps of: in advance of the pick-up location, parting the cover tape so as to create a cover tape flap and partially expose the component while keeping at least one edge of said cover tape affixed to the component carrier tape; and while feeding the component carrier tape, guiding the cover tape flap around the pick-up location, whereby the component is completely exposed and the cover tape flap will not interfere with retrieval of the component at the pick-up location.

The techniques described above are advantageous because they simplify the component feeders used with printed circuit assembly operations. By eliminating the need to separately handle the carrier and cover tape members, the component feeding process is simplified (e.g., fewer cover tape handling devices are employed) and made more reliable. Moreover, once the waste cover tape disposition problem is appropriately addressed, the cost of operation of carrier tape feeding systems will be reduced and the operation of the assembly system can proceed uninterrupted for longer periods of time.

The techniques of the present invention are advantageous because they provide a range of alternative parting techniques, each of which is useful in appropriate situations (e.g., component tape width). A wide variety of component feeding operations can be implemented using these techniques. Each technique can ensure that the component tape (carrier and cover) are fed to the pick-up location without separating the cover tape from the carrier tape, thereby simplifying disposal of the component tape. As a result of the invention, the maintenance of a component tape feeding system is significantly improved.

BRIEF DESCRIPTION OF THE DRAWINGS

FIGS. 7 and 8 are illustrations of an alternative, center-parting embodiment of the present invention;

Figure 1:
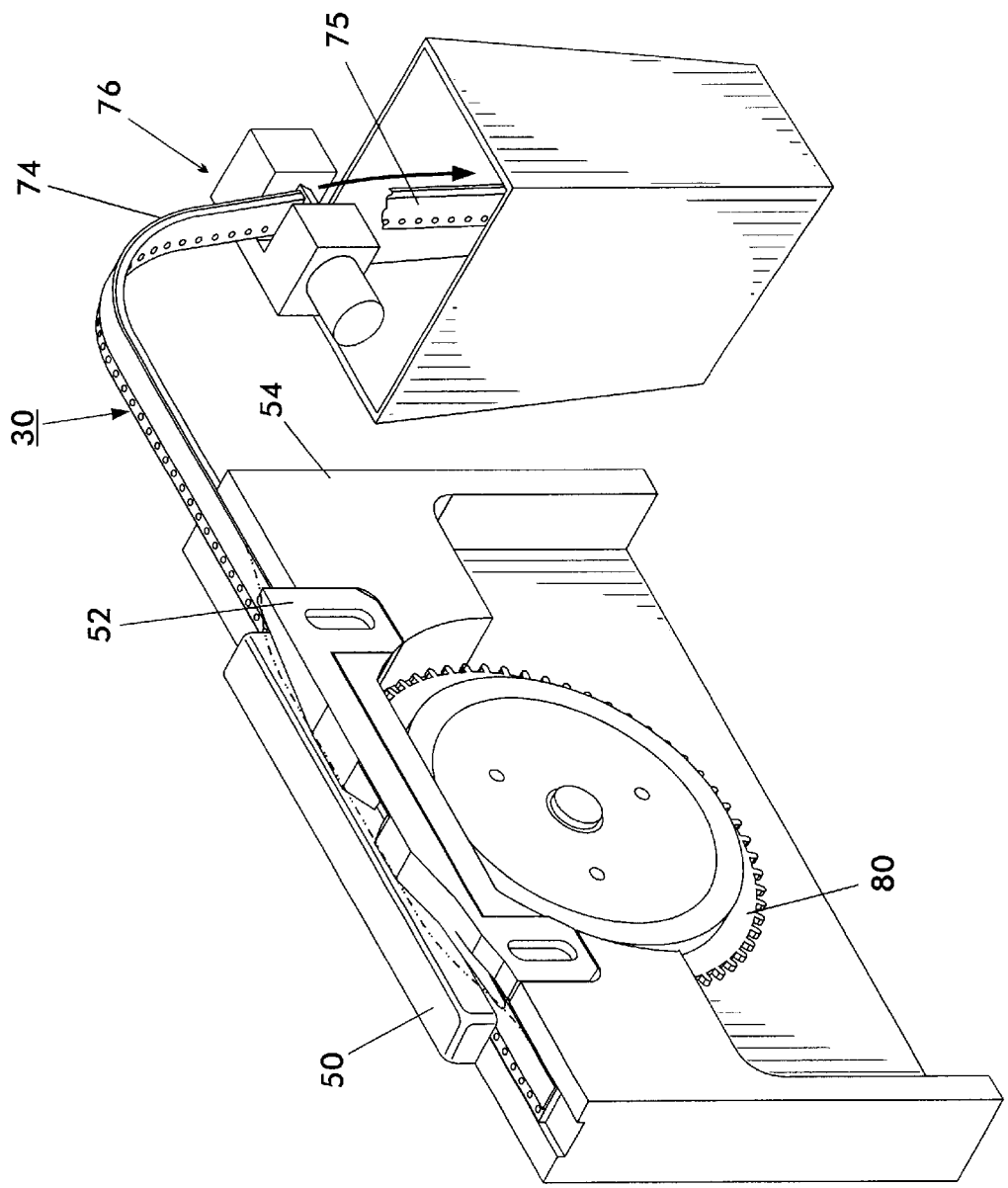
FIG. 1 is a perspective view of one embodiment of the present invention.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements. In describing the present invention, the following term(s) have been used in the description.

"Component" is used to represent any of a number of various elements that may be automatically retrieved and applied to a printed circuit board assembly (PCBA). "Carrier tape" is intended to represent a component feeding tape having at least a component tape or base layer with punched or embedded pockets in which the components are carried, and a cover tape layer thereover to retain the components within the pockets. Carrier tapes come in various widths, depending upon component size and are typically in the range of 8 to 56 mm. The parallel edges of the cover tape are affixed to the carrier layer using an adhesive or thermal process so the cover tape generally remains attached to the carrier layer when the component carrier tape is wound on a reel for ease of transportation and use.

Figure 2:
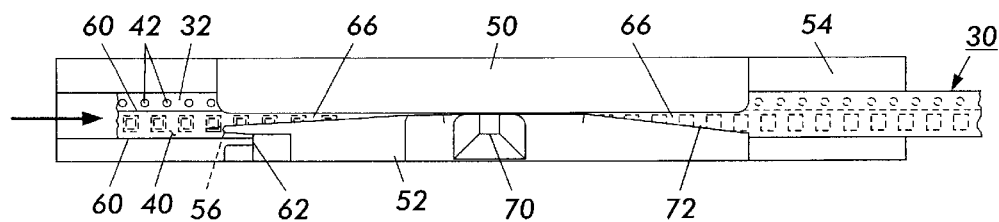
FIG. 2 is a top, plan view of the side-parting embodiment of the present invention.
Figure 3:
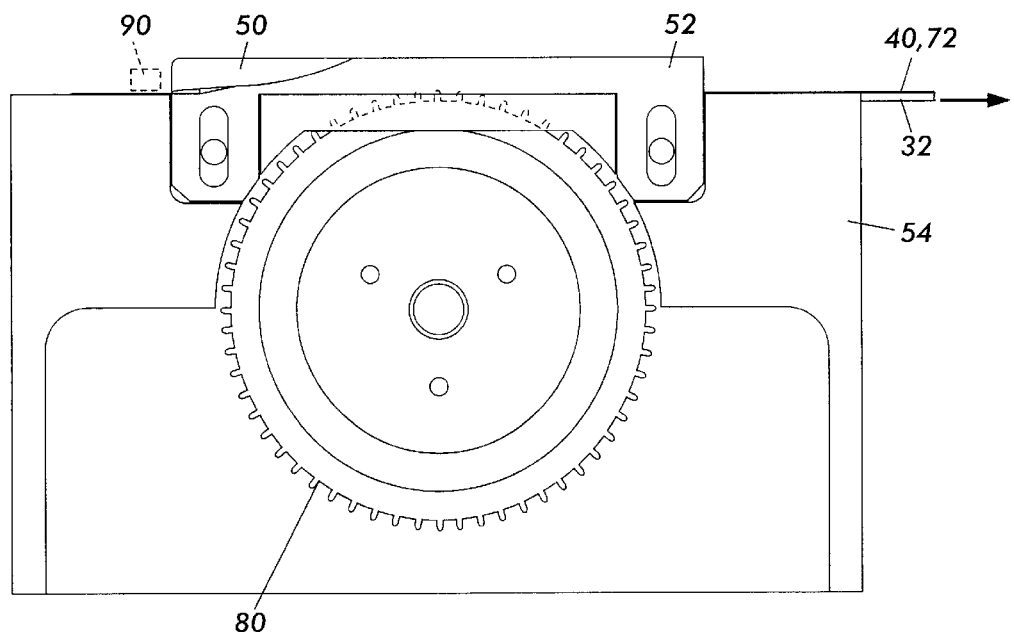
FIG. 3 is a side view of the embodiment of FIG. 2.
Figure 6:
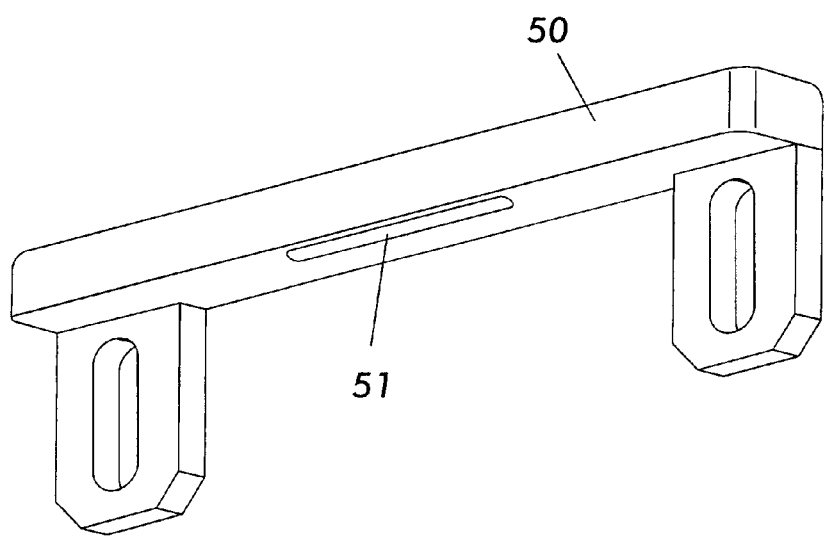

Referring now to FIGS. 1 through 3, one embodiment of the present invention will be generally described. Component carrier tape 30 is preferably fed beneath and between two anvils 50 and 52 operatively affixed to component feeder frame 54. A first anvil, 50, holds a first edge of the carrier tape and cover tape down and keeps the carrier tape stable and in contact with a tape drive mechanism (sprocket 80 and a drive motor (not shown) operatively associated therewith) beneath the carrier tape. Anvil 50, as depicted in FIG. 6, preferably includes a recess 51 in an underside thereof. Said recess being suitable to prevent the anvil from interfering with the teeth of sprocket 80. The second anvil 52 includes a separation or parting means such as a plow or finger 56 or equivalent mechanism for insertion between the component tape and cover tape. The finger preferably extends outward from anvil 52 in a direction opposite of carrier tape travel, and is located between the parallel adhesive strips along the longitudinal edges 60 of the cover tape.

As the carrier tape is advanced, the component tape passes beneath the finger and the cover tape passes above the finger. The finger lifts the cover tape up and separation edge 62, also part of the parting means, separates the adjacent edge of the cover tape from the component tape layer without separating the first side of the cover tape from the component tape layer. As the carrier tape advances the cover tape flap is folded upward, and possibly back, while it travels through channel 66 so as to expose the components within an aperture 70 formed in the upper surface of anvil 52. Aperture 70 is preferably provided at a pick-up location where an automated pick-and-place vacuum head can successfully position itself over the aperture and retrieve the component from the carrier tape.

Figure 4:
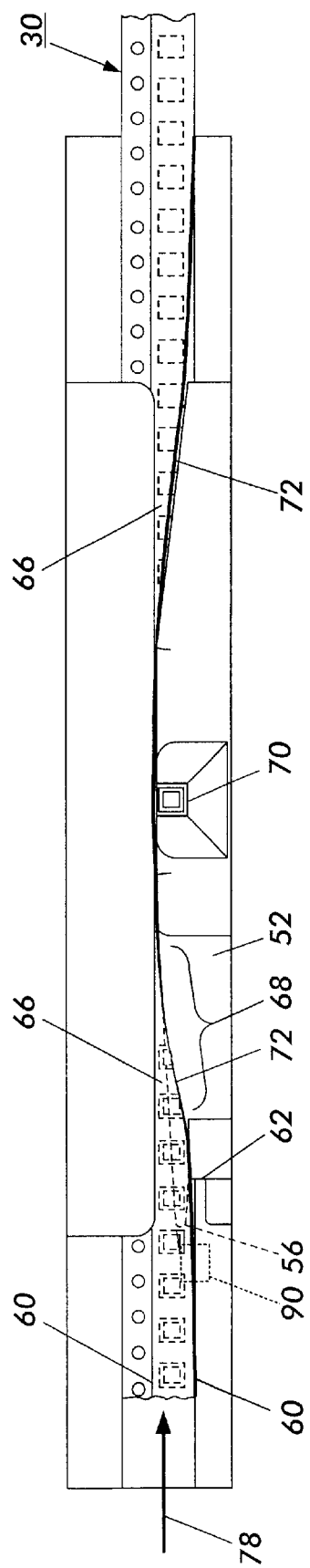
FIG. 4 is an enlarged view of FIG. 2 illustrating the cover tape flaps passing therethrough.

It will be further appreciated that the parting or separating means may include various combinations and designs, with or without a finger or plow 56. Moreover, designs for the parting means may include either a radiused or sharp separation edge 62. The orientation of separation edge 62 may also be either orthogonal to the longitudinal travel direction of the cover tape (78), as depicted in FIG. 4, or angled relative to the longitudinal direction. It is further contemplated that the entire anvil 52, or possibly just the separation edge 62 thereof, may be replaceable components that are interchanged depending upon the type of carrier tape used, or in the event of wear of the separation edge.

In the embodiment of FIGS. 1 through 3, the cover tape remains affixed to the component tape layer and is disposed along with the spent carrier tape; no further provision is necessary to deal with the cover tape flap. In particular, it is contemplated that subsequent to the pick-up location at aperture 70, the carrier tape is advanced out the end of frame 54 and into a channel 74 as illustrated in FIG. 1. Channel 74 directs the spent carrier tape downward past a cutter 76 (including at least one cutting edge and an opposed surface or edge) where the spent component carrier tape is cut into shorter lengths 75 to facilitate disposal thereof.

Figure 5:
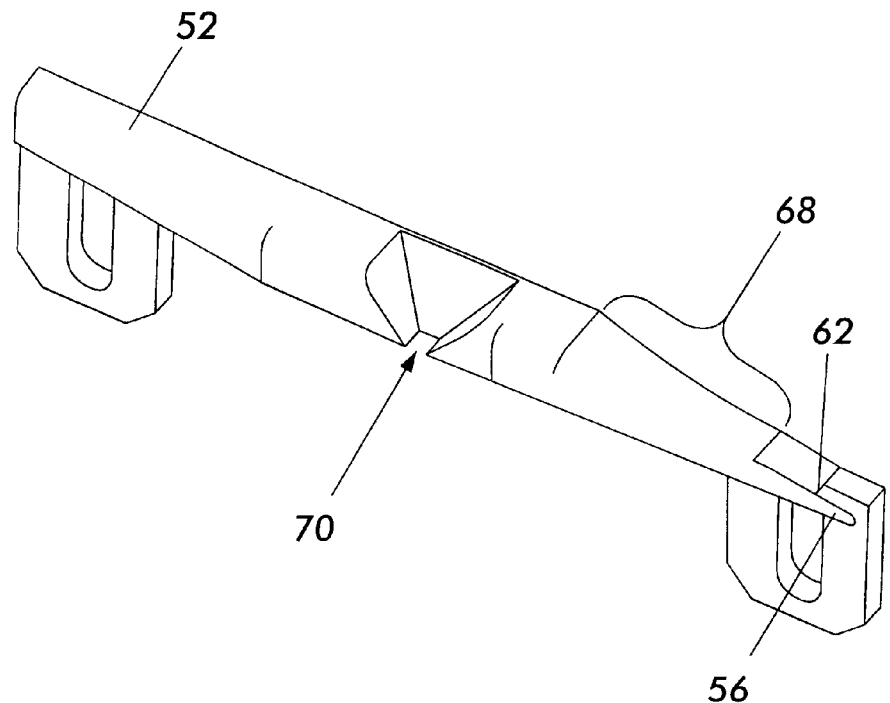
FIGS. 5 and 6 are perspective illustrations of the two anvils in FIGS. 1–4.

Having described the general operation of the apparatus with respect to FIGS. 1 through 3, attention is now turned to the remaining drawings provided to show aspects of the invention with increased clarity and to illustrate alternative embodiments. In FIG. 4, the first embodiment is shown in an enlarged plan (top) view. Carrier tape 30 is advanced from the left in the direction indicated by arrow 78. Carrier tape 30 includes pockets 34 and sprocket-holes or through-holes 42 that are used for controlling the advancement or position of the carrier tape with sprocket 80. Finger 56, shown more clearly in FIG. 5, extends from an end of anvil 52 in the direction of the approaching carrier tape.

In operation, finger 56 preferably passes between the top of carrier layer 32 and the cover tape 40 at a point between the two strips of adhesive holding the carrier tape and cover tape together. Anvil 50, as depicted in FIG. 6, holds the sprocket-hole side of the carrier tape down and prevents the cover tape from completely separating from the carrier tape base. Meanwhile, anvil 52, which includes upwardly-sloped region 68, gradually folds the cover tape flap 72 upward, preferably to at least about a 90 degree angle with the carrier base. It will be appreciated that folding the carrier flap 72 to a lesser or greater extent (75 to 135 degrees), or possibly curling the flap within a curved channel, is also contemplated by the embodiment of FIG. 4. The embodiment shown provides a 90-degree fold, however it is clear that folds greater than 90 degree may be as easily accomplished if necessary.

Referring again to FIG. 5, anvil 52 preferably includes aperture 70 having a recessed region thereabout for exposing successive pockets 34 and components 36 therein. The aperture is positioned at a pick-up location along anvil 52, where cover tape flap 72 has been retracted or folded in an upward direction, away from carrier tape 32 so that the component location is no longer covered by the cover tape and is accessible by a host pick and place vacuum head (not shown).

As the carrier tape continues to be advanced by drive sprocket 80, the cover tape flap 72 may or may not fold back in place over carrier tape 30, as depicted on the rightmost side of FIG. 4, where it is shown as returning to a position proximate its state before folding.

Referring again to FIGS. 3 and 4, there is also depicted an alternative embodiment, wherein a heater or heating element 90 is employed. In this alternative embodiment, the cover tape parting means further includes a heating element for applying heat to the cover tape along the edge to be parted. Although various configurations are possible, heating element 90 is believed to be of most benefit if it is placed in close proximity to the cover tape in a location above and immediately preceding the finger 56 and separation edge 62. The heater, preferably a radiant heating device, however alternative heating devices such as focused-beam lasers, contact (conductive) heaters such as ceramic resistive heaters may be used. While preferably positioned above the cover tape, it is also possible for heating element 90 to be positioned to the side or below the carrier tape (particularly for metallic component carrier tape feeders).

It is further contemplated that the heating element may be conformably or resiliently affixed to the frame 54 while being thermally insulated therefrom so as to minimize the dissipation of heat from the parting area by conduction through the frame. Because of the nature of the feeder operation, it is also contemplated that the heater may be controlled using one or a combination of control methods. First, the heater may be controlled so as to produce a constant temperature on the edge of the component carrier tape as sensed by a heat sensor such as a thermocouple (not shown). It will be appreciated that a desired temperature is sufficient to cause a loosening of the cover tape adhesive force, but not the degradation of the component tape, cover tape or melting of the adhesive.

Second, the heating element may be operated in an on-demand control state, whereby heat is applied only at specific times (e.g., just prior to or during the beginning of the advancement of the component carrier tape). In this mode, application of heat is limited, and there is less likelihood of damage or adhesive melting during extended tape dwell times. As noted above, it is also possible to utilize a combination of the two control mechanisms to further control the application of heat so as to slightly loosen the adhesive bond while avoiding the problem of initiating the flow or transfer of a liquefied adhesive.

In yet another alternative embodiment for the present invention, FIGS. 7 and 8 illustrate a center-parting apparatus suitable for use on larger component tape feeders. For larger components (e.g., tape widths of 56 mm), the peeling back of the cover tape may result in a cover tape flap that extends a significant distance in the vertical direction. However, because of the nature of the host assembly systems, the vertical extension of the cover tape flap may interfere with the host system pick-and-place head or components attached thereto. The embodiment of FIGS. 7 and 8 is intended to alleviate this potential problem by cutting the cover tape and peeling or retracting both of the cover tape flaps to their respective sides so as to expose the component therebetween.

In particular, as wide component carrier tape 130 is advanced in the direction of arrow 132, plow or nose 136 is placed between the bottom of the cover tape and the top of the components and component tape, in the same manner as the finger of the previous embodiment. Plow 136 serves to slightly lift the cover tape, and preferably cuts the cover tape with a replaceable knife or razor edge 140, thereby creating two cover tape flaps 144 and 146 that are forced upward and away from the center of the carrier tape by the plow as the tape advances. In the center-parting embodiment of FIG. 7, the cover tapes flaps are preferably constrained so as not to occlude or block access to the top surface of component 36. It is possible that the flaps are retained in parallel channels 166 on either side of the plow; however, it may be suitable to simply use a guide that prevents the flaps from interfering with retrieval of the component via aperture 170.

As further illustrated in FIG. 8, it is also possible that flaps 144 and 146 may be rolled back via channels or guides that shape the flaps in a helical form. Such an embodiment will serve to further reduce the vertical profile of the flaps, and present less interference with the host system's pick-and-place head and components attached thereto.

Figure 9:
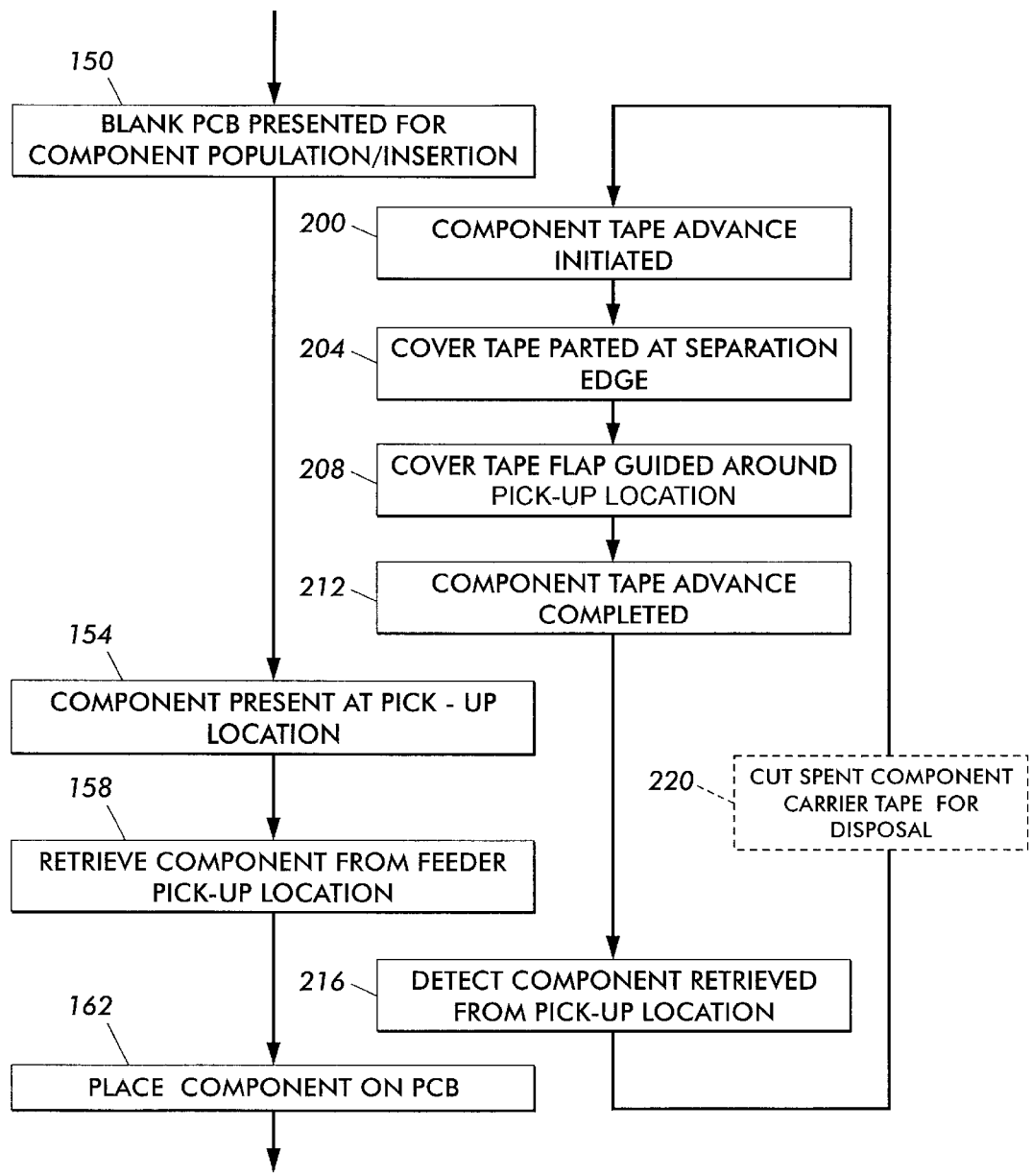
FIG. 9 is a flowchart depicting particular steps in the parting of the cover tape in accordance with various aspects of the present invention.
Figure 10:
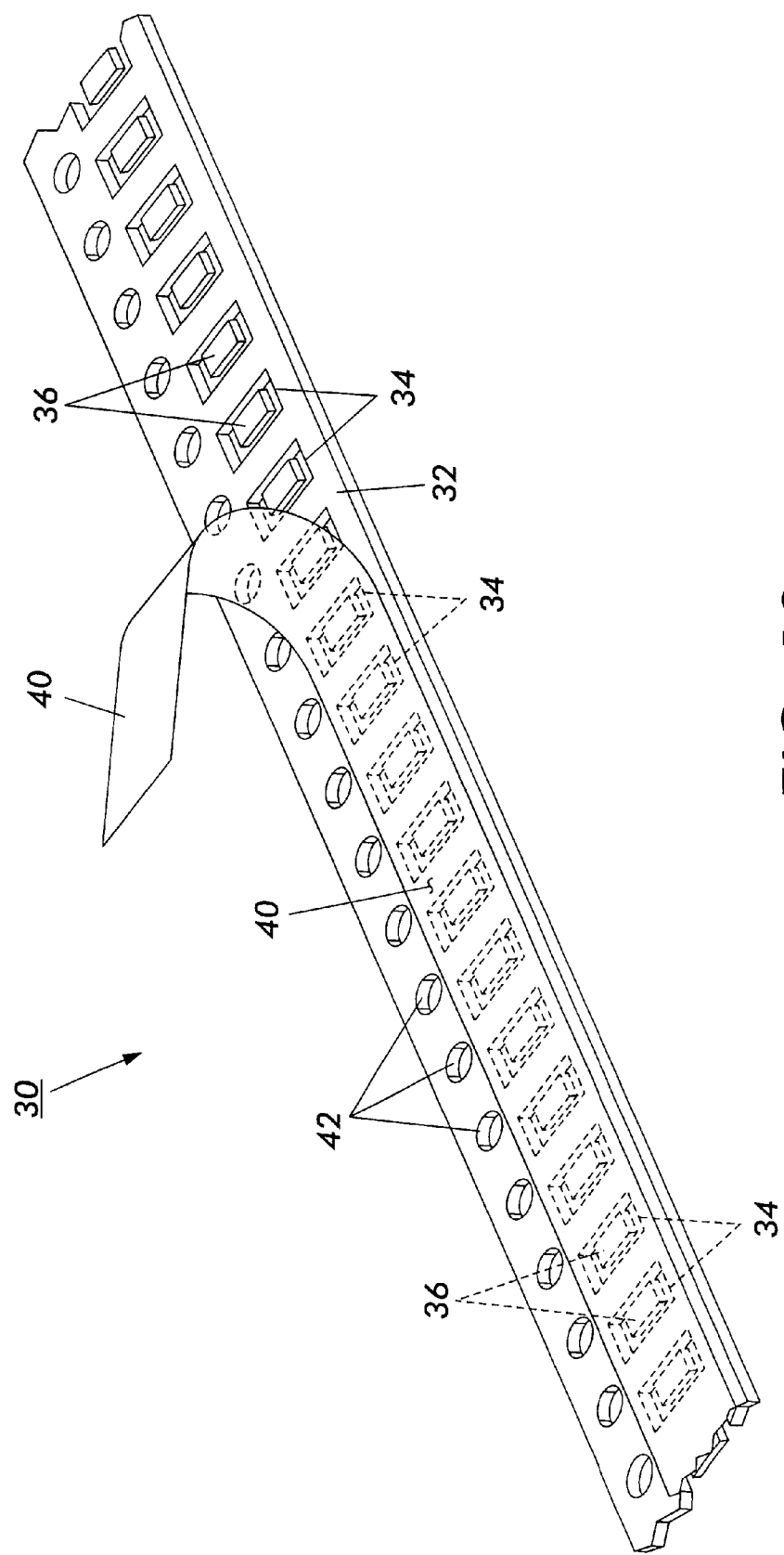
FIG. 10 is a representation of a conventional (prior art) component carrier tape.

Turning last to FIG. 9 there is illustrated a flowchart depicting the various process steps accomplished by the component feeder in accordance with the present invention. The left side of FIG. 9 illustrates steps carried out by the host system and its associated assembly apparatus, whereas the center and right-most steps are preferably accomplished by elements of the present invention. Beginning with step 150, a blank printed circuit board is presented for component insertion. Concurrently, the component tape is advanced at step 200 to begin positioning a component for retrieval. As the component carrier tape is advanced, the cover tape is parted (side or center) as represented by step 204, and the flap(s) are guided around the pick-up location, step 208.

Once the tape is advanced sufficiently to present a new pocket and component for retrieval, advance of the carrier tape is stopped, step 212. At this point, the component is considered as being presented at the pick-up location, step 154. Next, the assembly system gantry retrieves the component, step 158, causing the component feeder to detect that the component has been retrieved, step 216, and the component is placed on the printed circuit board, step 162. Step 216 initiates the component advancement process, and may optionally initiate a periodic cutting operation as depicted by step 220. It will also be appreciated that one or more of the various steps 200–220 may be employed to trigger or control energizing of the heater as described above.

The various embodiments of the present invention described herein are considered improvements over existing component tape feeding systems. Accordingly, the present invention contemplates and is intended to incorporate therein an entire feeding apparatus employing the methods and embodiments described above. A complete feeder is neither discussed nor shown in the drawings, as this is believed unnecessary in view of the prior art feeder technology that is well-known (e.g., in the patents referenced above, all of which have been previously incorporated by reference)

In recapitulation, the present invention is a method and apparatus for parting and peeling-back the cover tape on a component carrier tape in order to expose the component for retrieval by an automated assembly system. More specifically, the cover tape is parted along one edge, or slit in the middle for wider component tapes. The cover tape flap(s) created by the parting operation are then retracted back away from the region above the component, whereby the component is exposed for retrieval at the pick-up location. Subsequent to the pick-up location, the carrier tape with the parted cover tape flap(s) still attached thereto, are then directed to a waste receptacle or similar disposal mechanism, avoiding the need for a separate cover tape take-up reel.

It is, therefore, apparent that there has been provided, in accordance with the present invention, a method and apparatus for cover tape parting so as to partially expose the component for retrieval. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A component feeding apparatus for supplying components to an automated assembly system, said system using a component feeding means having a length of carrier tape with a plurality of regularly spaced pockets in the component tape, each pocket holding a component therein, and a cover tape layer thereover to retain the components within each pocket until the component approaches a pick-up location, comprising:

means for parting the cover tape so as to partially expose the component while keeping at least one edge of said cover tape affixed to the component tape;

a channel for guiding a cover tape flap around the pick-up location, whereby said channel folds said cover tape along a line adjacent to a second edge and at an angle of about 90 degrees relative to an upper surface of the carrier tape, and where the component is completely exposed and the cover tape flap will not interfere with retrieval of the component at the pick-up location; and wherein said parting means includes a heating element for applying heat to the cover tape along the edge to be parted.

2. The apparatus of claim 1, wherein said parting means separates the component tape from the cover tape along one edge thereof.

3. The apparatus of claim 1, wherein said parting means includes a finger for lifting the cover tape and presenting the sealed edge thereof to a peeling edge.

4. The apparatus of claim 1, wherein said parting means includes:

a finger for lifting the cover tape and presenting the sealed edge thereof to a peeling edge; and wherein said heating element is positioned above the carrier tape in a position adjacent the finger.

5. The apparatus of claim 1, wherein said parting means includes:

a finger for lifting the cover tape and presenting the sealed edge thereof to a peeling edge; and wherein said heating element is positioned below the component tape in a position adjacent the finger.

6. The apparatus of claim 1, wherein said heating element is selected from the group consisting of:

a radiant heating element;

a ceramic heating element; and a focused-beam laser.

7. The apparatus of claim 1, wherein said parting means is a device for cutting the cover tape at a location between the two edges thereof, and retracting at least one flap of the cut cover tape.

8. The apparatus of claim 1, wherein said parting means is a device for cutting the cover tape at a location between the two edges thereof to form two cover tape flaps, and folding back both of the cover tape flaps, each flap in one of a pair of parallel channels formed on either side of the pick-up location.

9. The apparatus of claim 8, wherein said device for cutting the cover tape is a replaceable knife edge.

10. The apparatus of claim 1, wherein said feeding apparatus further comprises a guide, adjacent the pick-up location, for directing the component tape and the cover tape flap to a disposal receptacle below the pick-up location.

11. The apparatus of claim 10, wherein said feeding apparatus further comprises means for cutting the component tape and attached cover tape into smaller lengths for ease of disposal.

12. A component feeder for supplying electronic components to an automated assembly system for assembling printed circuit boards, said system using a component feeding means having a length of carrier tape including a component tape with a plurality of regularly spaced pockets, each pocket holding a component therein, and a cover tape thereover to hold the components within each pocket until the component approaches a pick-up location, comprising:

a means for separating a single edge of the cover tape from the component tape and folding said cover tape along a line adjacent to a second edge at least about 90 degrees from the plane of said component tape, wherein said means for separating a single edge of the cover tape includes a heating element for applying heat to the cover tape along the edge to be separated; and means for maintaining said cover tape in retracted condition as said component tape passes a pick-up location where successive pockets in said component tape are exposed, such that a pick and place machine may have access to any electrical components located in a pocket located at said pick-up location.

13. In a component feeding apparatus for supplying components to an automated system for assembling printed circuit boards, said system using a component feeding means having a length of carrier tape including a component tape with a plurality of regularly spaced pockets, each pocket holding a component therein, and a cover tape thereover to retain the components within each pocket until the component approaches a pick-up location, a method of presenting components for retrieval at the pick-up location, comprising the steps of:

in advance of the pick-up location, parting the cover tape so as to create a cover tape flap and partially expose the component while keeping at least one edge of said cover tape affixed to the component tape, wherein the step of parting the cover tape includes applying heat to the cover tape along an edge to be parted; and while feeding the carrier tape, guiding the cover tape flap around the pick-up location in a channel, whereby said channel folds said cover tape along a line adjacent to a second edge and at an angle of about 90 degrees relative to an upper surface of the carrier tape, and where the component is completely exposed and the cover tape flap will not interfere with retrieval of the component at the pick-up location.

14. The method of claim 13, wherein the step of parting the cover tape includes separating the component tape from the cover tape along one edge thereof.

15. The method of claim 13, wherein the step of parting the cover tape includes lifting the cover tape and presenting the edge to be parted to a separation edge.

16. The method of claim 13, further including the steps of:
   directing the component tape and the cover tape flap affixed thereto toward a disposable receptacle; and
   cutting the component tape and attached cover tape into smaller lengths.

* * * * *